United States Patent
Takeshita et al.

(10) Patent No.: US 8,610,166 B2
(45) Date of Patent: Dec. 17, 2013

(54) LIGHT EMITTING DEVICE

(75) Inventors: Atsushi Takeshita, Fukuoka-ken (JP);
Yuichi Ikedo, Fukuoka-ken (JP);
Tetsuya Muranaka, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/432,955

(22) Filed: Mar. 28, 2012

(65) Prior Publication Data

US 2013/0062613 A1    Mar. 14, 2013

(30) Foreign Application Priority Data

Sep. 13, 2011   (JP) ................................. 2011-199048

(51) Int. Cl.
*H01L 33/54* (2010.01)
(52) U.S. Cl.
USPC  257/100; 257/99; 257/E33.066; 257/E33.056
(58) Field of Classification Search
USPC ................... 257/79–100, E33.066, E33.056, 257/E33.059
See application file for complete search history.

(56) References Cited

U.S. PATENT DOCUMENTS

| | | | |
|---|---|---|---|
| 8,067,779 B2 | 11/2011 | Muranaka et al. | |
| 2008/0029775 A1* | 2/2008 | Liu et al. | 257/98 |
| 2008/0224161 A1* | 9/2008 | Takada | 257/98 |
| 2010/0327298 A1* | 12/2010 | Konno et al. | 257/94 |
| 2011/0163345 A1* | 7/2011 | Fukunaga | 257/98 |
| 2011/0249424 A1* | 10/2011 | Joo et al. | 362/97.1 |

FOREIGN PATENT DOCUMENTS

| | | | |
|---|---|---|---|
| JP | 06-338583 | 12/1994 | |
| WO | WO/2010/071386 | * 6/2010 | H01L 33/52 |

* cited by examiner

*Primary Examiner* — Matthew W Such
*Assistant Examiner* — Ali Naraghi
(74) *Attorney, Agent, or Firm* — Patterson & Sheridan, LLP

(57) ABSTRACT

According to one embodiment, a light emitting device includes a first lead, a light emitting element, a second lead and a molded body. The light emitting element is fixed on the first lead. The second lead is provided away from the first lead and electrically connected to the light emitting element via a metal wire. The, molded body made of a sealing resin covers the light emitting element, end portions of the first lead and the second lead, the light emitting element being fixed on the end portion of the first read, and the metal wire being bonded on the end portion of the second lead. The first groove is provided between first and second portions in a front surface of the second lead, the first portion being in contact with an outer edge of the molded body and the metal wire being bonded on the second portion.

19 Claims, 4 Drawing Sheets

LIGHT EMITTING DEVICE

CROSS-REFERENCE TO RELATED APPLICATIONS

This application is based upon and claims the benefit of priority from the prior Japanese Patent Application No. 2011-199048, filed on Sep. 13, 2011; the entire contents of which are incorporated herein by reference.

FIELD

Embodiments described herein relate generally to a light emitting device.

BACKGROUND

A highly reliable high-power light emitting device is required for uses such as vehicle exteriors and traffic signals. For example, a light emitting device including a light emitting diode (LED) is a light source with a small size, high power, and low power consumption, and is suitable for these uses.

However, the device has also a problem that needs to be solved in order to improve the reliability. For example, in a light emitting device using a lead frame, peeling may occur between a transparent resin that seals a light emitting element and the lead frame. Thus, a light emitting device is required in which the adhesive strength between the lead frame and the sealing resin is increased to improve reliability.

DETAILED DESCRIPTION

Figure 1:
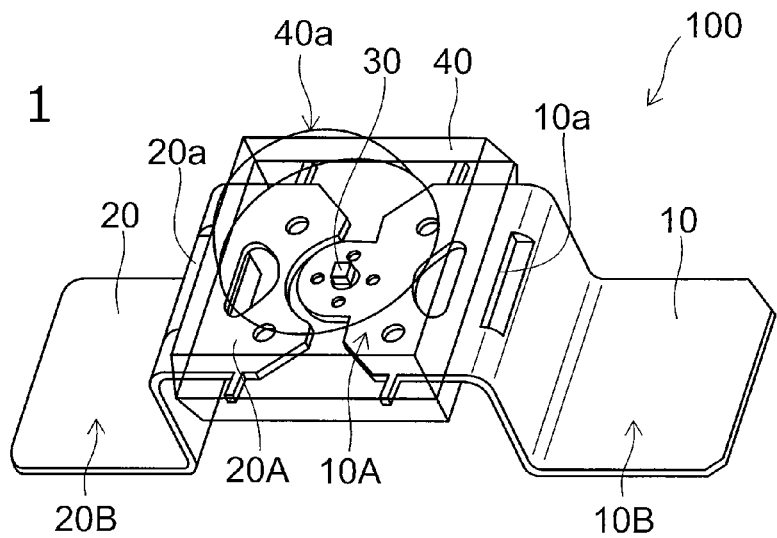
FIG. 1 is a perspective view schematically showing a light emitting device according to an embodiment.

According to one embodiment, a light emitting device includes a first lead, a light emitting element, a second lead and a molded body. The light emitting element is fixed on the first lead. The second lead provided away from the first lead and electrically connected to an electrode of the light emitting element via a metal wire. The molded body is made of a sealing resin covering the light emitting element, an end portion of the first lead and an end portion of the second lead, the light emitting element being fixed on the end portion of the first lead, and the metal wire being bonded on the end portion of the second lead. The first groove is provided between a first portion and a second portion in a front surface of the second lead, the first portion being in contact with an outer edge of the molded body, and the metal wire being bonded on the second portion, the first groove intersecting with a direction from the outer edge of the molded body to the second portion and filled with the sealing resin.

Various embodiments will be described with reference to the accompanying drawings. Identical components in the drawings are marked with the same reference numerals, and a detailed description thereof is omitted as appropriate and different components are described. A description may be given with reference to an XY orthogonal coordinate system shown in drawings.

FIG. 1 is a perspective view schematically showing a light emitting device 100 according to the embodiment. As shown in the drawing, the light emitting device 100 includes a first lead 10, a second lead 20, a light emitting element 30, and a molded body 40 made of a sealing resin.

The light emitting element 30 is, for example, an LED, and is fixed on an end portion 10A of the first lead 10. The second lead 20 is provided away from the first lead 10. An end portion 20A of the second lead 20 is disposed opposite to the end portion 10A of the first lead 10 to which the light emitting element 30 is fixed.

The molded body 40 is a sealing resin covering the light emitting element 30, the end portion 10A of the first lead 10 on the side where the light emitting element 30 is fixed, and the end portion 20A of the second lead 20, and is molded using, for example, a transfer mold. A transparent resin such as a silicone, epoxy resin, and acrylic resin may be used for the molded body 40.

Here, "transparent" refers to transmitting the light that the light emitting element 30 emits. For example, the term is not limited to the case of transmitting 100% of the emission light of the light emitting element 30 but it is sufficient to transmit at least part of it.

The light emitting element 30 includes, for example, a stacked body of $In_x(Ga_yAl_{1-y})_{1-x}P$ ($0 \le x \le 1$, $0 \le y \le 1$) or $Al_xGa_{1-x}As$ ($0 \le x \le 1$), and emits green to red light. It is also possible use what includes a stacked body of $In_xGa_yAl_{1-x-y}N$ ($0 \le x \le 1$, $0 \le y \le 1$, $x+y \le 1$) and emits ultraviolet through blue to green light.

Portions not covered with the molded body 40 of the first lead 10 and the second lead 20 (hereinafter external leads 10B and 20B) are bend-processed so as to be easily mounted on a circuit substrate. For example, after the molded body 40 covering the light emitting element 30, the first lead 10, and the second lead 20 is formed, the external leads 10B and 20B protruding from the molded body 40 are press-processed into a configuration of what is called gull wings. In the bend portions near the molded body 40, openings 10a and 20a lying along the folds are provided. Thereby, bend processing along the folds becomes easy.

A copper-based alloy with a thickness of 0.25 mm, for example, may be used for the first lead 10 and the second lead 20. The surfaces of the leads are coated with a metal that reflects the emission light of the light emitting element 30 to increase the light output of the light emitting device 100. For example, the surfaces of the leads may be plated with Ag or coated with a metal layer in which Ni/Pd/Au are stacked in this order. The thickness of Ag is set to, for example, 10 μm. In the case of the metal layer, for example, Ni is made 1 μm, Pd is made 0.03 μm, and Au is made 0.01 μm. The metals are provided at least on the front surfaces of the leads on the side where the light emitting element 30 is fixed.

Figure 2A:
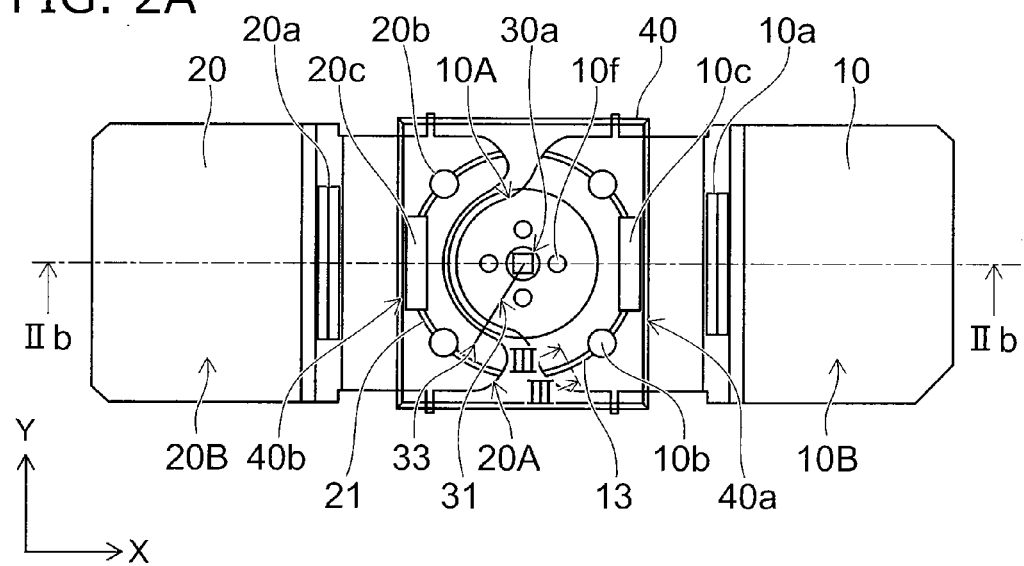
FIGS. 2A and 2B are plan views showing a structure of the light emitting device according to the embodiment.
Figure 2B:
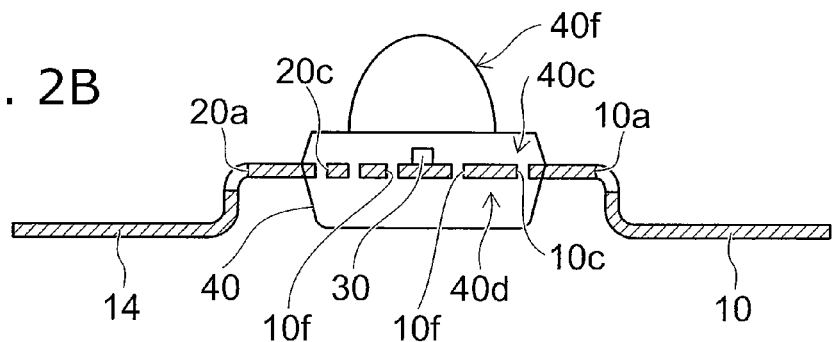

Next, the light emitting device 100 is described in detail with reference to FIGS. 2A and 2B. FIG. 2A is a plan view schematically showing the light emitting device 100, and FIG. 2B is a cross-sectional view taken along line IIb-IIb.

The first lead 10 includes the end portion 10A sealed by the molded body 40 and the external lead 10B. The end portion 10A is a die pad to which the light emitting element 30 is fixed, and is provided such that part of the end portion 10A protrudes toward the second lead 20. An anchor hole 10f is provided around the portion where the light emitting element 30 is fixed.

On the other hand, also the second lead 20 includes the end portion 20A sealed by the molded body 40 and the external lead 20B. The end portion 20A of the second lead 20 is provided away from the end portion 10A of the first lead 10, and is electrically connected to an electrode of the light emitting element 30 via a metal wire 31.

Anchor holes 10b and 10c are provided in the end portion 10A of the first lead 10, and anchor holes 20b and 20c are provided in the end portion 20A of the second lead 20. These anchor holes are provided on the outside of the anchor hole 10f from the light emitting element 30, and fix the leads to the molded body 40.

In the embodiment, in the front surface of the second lead 20 to which the metal wire 31 is bonded, a first groove 21 is provided between a first portion 40b in contact with the outer edge of the molded body 40 and a second portion 33 to which the metal wire 31 is bonded. The first groove 21 is provided so as to intersect with the direction from the first portion 40b toward the second portion 33, and the inside of the first groove 21 is filled with a sealing resin.

Furthermore, in the front surface of the first lead 10 to which the light emitting element 30 is fixed, a second groove 13 is provided between a third portion 40a in contact with the outer edge of the molded body and a fourth portion 30a to which the light emitting element 30 is fixed. The second groove 13 is provided so as to intersect with the direction from the third portion 40a toward the fourth portion 30a, and the inside of the second groove 13 is filled with a sealing resin.

Here, the first portion 40b in contact with the outer edge of the molded body 40 refers to a linear portion where the outer edge of the molded body 40 and the second lead are in contact. The direction from the first portion 40b toward the second portion 33 refers to the direction from an arbitrary point in the first portion 40b toward the second portion 33. This applies also to the direction from the third portion 40a toward the fourth portion 30a. For the sake of convenience, the following description is given on the assumption that the first portion 40b is the outer edge 40b of the molded body, the second portion 33 is a bonding portion 33, the third portion is the outer edge 40a of the molded body, and the fourth portion 30a is the light emitting element 30.

The first groove 21 shown in FIG. 2A is provided between the anchor holes 20b and 20c and from the anchor hole 20b to the outer edge of the second lead 20. On the other hand, the second groove 13 is provided between the anchor holes 10b and 10c and from the anchor hole 10b to the outer edge of the first lead 10. Thereby, in the end portion 20A of the second lead, the portion between the outer edge 40b of the molded body 40 and the boding portion 33 is partitioned by the first groove 21. Furthermore, in the end portion 10A of the first lead, the portion between the outer edge 40a of the molded body and the light emitting element 30 is partitioned by the second groove 13.

Although each of the first groove 21 and the second groove 13 is provided in a circular arc configuration surrounding the light emitting element 30 in the example mentioned above, the configuration is not limited thereto. Any groove that defines a boundary between the outer edge 40b of the molded body 40 and the bonding portion 33 or between the outer edge 40a of the molded body and the light emitting element 30 may be provided in an arbitrary configuration and position. Furthermore, the first groove 21 and the second groove 13 are not limited to a configuration of being connected to an anchor hole, but a simple one groove of which both ends reach the outer edge of the lead is possible.

FIG. 2B is a schematic view showing a cross section of the light emitting device 100. The molded body 40 includes a base portion 40c covering the side of the front surface of the first lead 10 to which the light emitting element 30 is fixed and the front surface of the second lead 20 to which the metal wire 31 is bonded and a base portion 40d covering the back surfaces of the leads. The base portion 40c and the base portion 40d are molded so as to be connected via a plurality of through holes (anchor holes) piercing from the front surfaces to the back surfaces of the first lead 10 and the second lead 20. Furthermore, the base portion 40c and the base portion 40d are molded to be connected also in the space between the first lead 10 and the second lead 20.

Thereby, the base portion 40c and the base portion 40d are molded as one body across the end portion 10A of the first lead and the end portion 20A of the second lead, and fix the leads. That is, in addition to the adhesive strength between the sealing resin forming the molded body 40 and the leads, also the anchor holes fix the end portions of the leads. For example, the anchor holes 10b, 10c, and 10f strengthen the adhesion, what is called the "bite," of the molded body 40 to the end portion 10A of the first lead and prevent misalignment in a direction parallel to the front surface of the end portion 10A of the first lead. On the other hand, the anchor holes 20b and 20c strengthen the bite of the molded body 40 to the end portion 20A of the second lead, and prevent misalignment in a direction parallel to the front surface of the end portion 20A of the second lead.

A lens portion 40f that condenses the emission light of the light emitting element 30 is provided on the base portion 40c covering the light emitting element 30.

Figure 6:
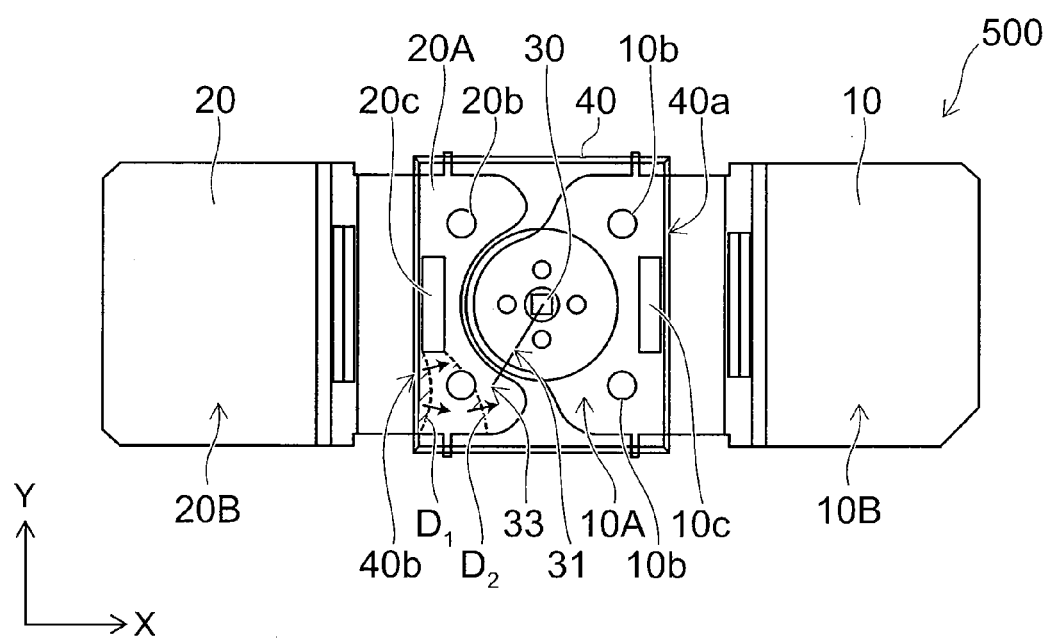
FIG. 6 is a plan view schematically showing a light emitting device according to a comparative example.

Next, the functions of the first groove 21 and the second groove 13 are described with reference to FIG. 6. FIG. 6 is a plan view schematically showing a light emitting device 500 according to a comparative example. As shown in the drawing, in the light emitting device 500, the first groove 21 and the second groove 13 are not provided.

As described above, the end portion 10A of the first lead is fixed to the molded body 40 not only by the adhesive strength between the resin forming the molded body 40 and the lead but also by the anchor holes 10b, 10c, and 10f. Furthermore, the end portion 20A of the second lead is fixed to the molded body 40 by the anchor holes 20b and 20c.

However, since the difference in linear expansion coefficient between the leads made of a metal and the molded body 40 made of a sealing resin is large, stress may occur between the molded body 40 and the leads, and the molded body 40 may be peeled off from the leads. For example, in a cooling process after the injection molding of the molded body 40, a peeling region $D_1$ may be formed from the outer edge 40b of the molded body along the front surface of the end portion 20A of the second lead. Then, if temperature increases and temperature decreases are repeated in subsequent operating states, for example, the peeling region progresses in the direction of the arrows in the drawing (from $D_1$ to $D_2$). As a result, if the peeling region reaches the bonding portion 33, the metal wire 31 is peeled off from the front surface of the second lead 20, and this causes an open fault in which no current flows through the light emitting element 30.

On the other hand, also on the side of the first lead 10, if peeling spreads from the outer edge 40a of the molded body toward the light emitting element 30, for example, external water may reach the light emitting element 30 to degrade the characteristics thereof.

In view of this, in the light emitting device 100 according to the embodiment, the first groove 21 that defines a boundary between the outer edge 40b of the molded body and the bonding portion 33 is provided. Thereby, the progress of the peeling region is suppressed, and an open fault of the light emitting element 30 is prevented. Furthermore, by providing the second groove 13 that defines a boundary between the outer edge 40a of the molded body and the light emitting element 30, the progress of the peeling region is suppressed, and characteristic degradation of the light emitting element 30 is prevented.

Figure 3A:
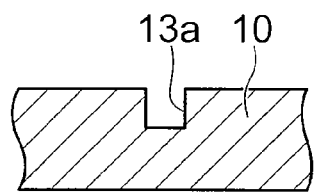
FIG. 3A to FIG. 3F are schematic views showing the cross section of a groove according to the embodiment.
Figure 3B:
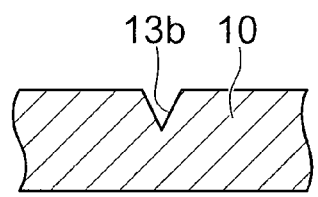
Figure 3C:
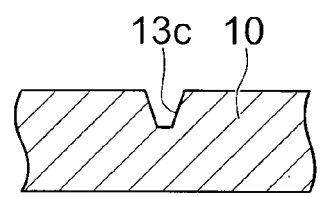

FIG. 3A to FIG. 3F are schematic views showing the III-III cross section of the second groove 13. The second groove 13 may be a groove 13a provided in a rectangular configuration running in the depth direction from the front surface of the first lead 10 as shown in FIG. 3A, or may be a groove 13b provided in a triangular configuration as shown in FIG. 3B. Furthermore, as shown in FIG. 3C, a groove 13c in an inverted trapezoidal configuration with a small bottom surface is possible. Grooves with these configurations may be formed simultaneously with the press processing of the first lead 10, for example. It goes without saying that also the first groove 21 can be formed simultaneously.

Figure 3D:
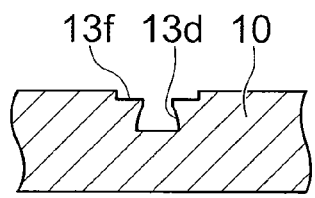

As shown in FIG. 3D, it is also possible to form a groove 13d in a configuration in which the groove width increases with depth from the front surface of the first lead 10. The groove 13d is formed by, for example, a method in which a shallow groove 13f shown in the drawing is formed, then an etching mask is formed on the front surface of the first lead 10, and the metal forming the lead is selectively etching. A groove with such a configuration increases the adhesive strength (bite) between the front surface of the lead and the molded body 40.

Figure 3E:
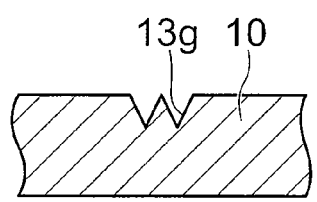
Figure 3F:
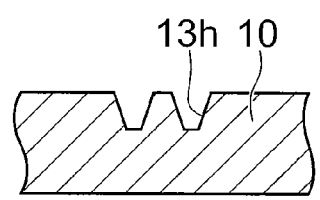

Furthermore, it is also possible to form a double groove 13g shown in FIG. 3E in which triangular grooves are aligned or a double groove 13h shown in FIG. 3F in which inverted trapezoidal grooves are aligned. Thus, by forming the groove doubly, the spread of the peeling region D can be more effectively suppressed.

Figure 4A:
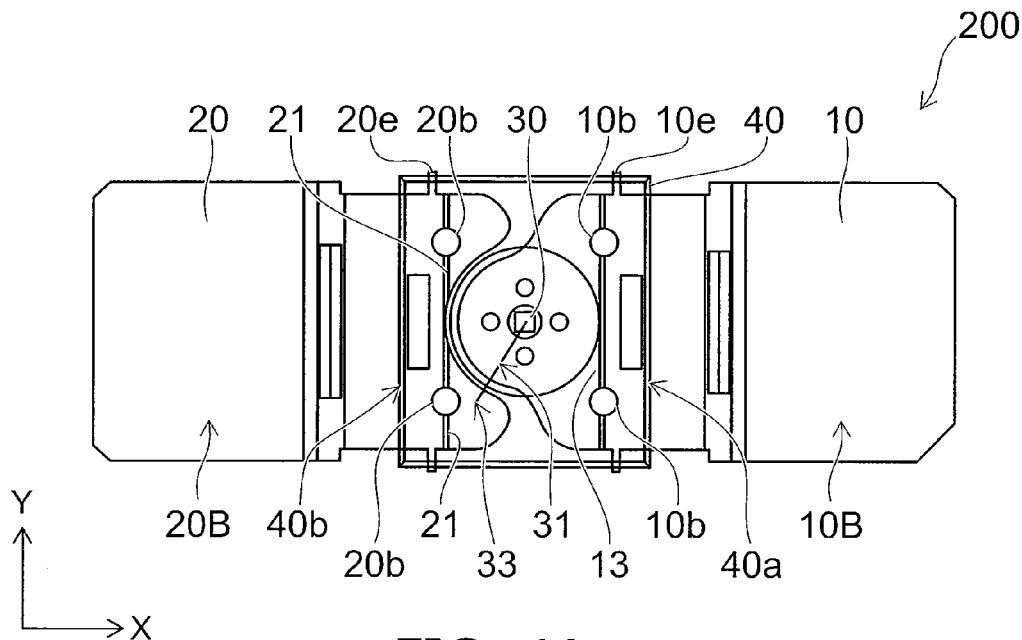
FIGS. 4A and 4B are plan views schematically showing light emitting devices according to variations of the embodiment.
Figure 4B:
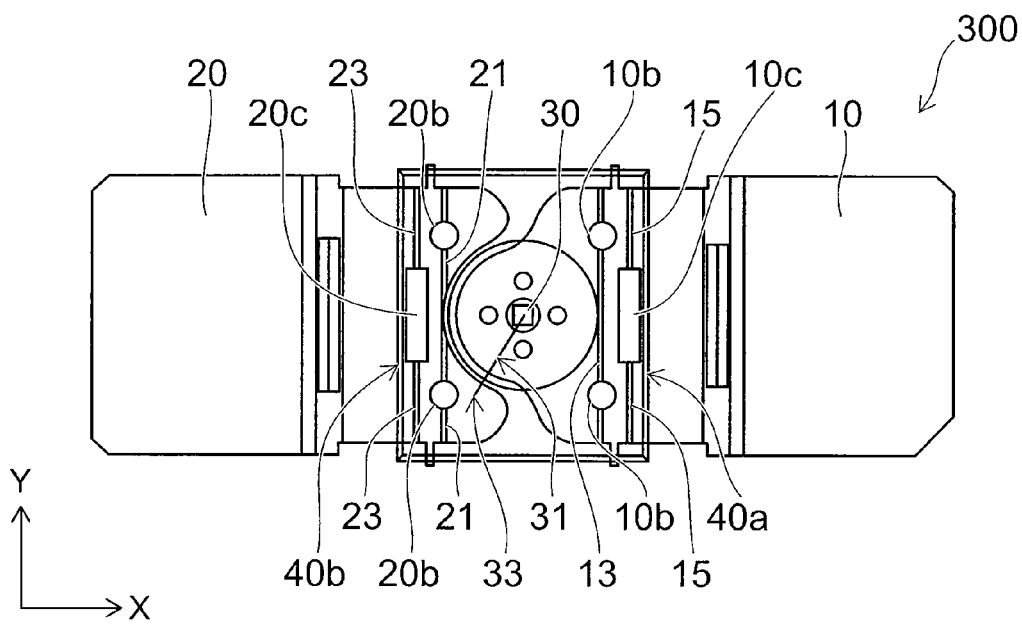

FIGS. 4A and 4B are plan views schematically showing light emitting devices 200 and 300 according to variations of the embodiment.

In the light emitting device 200 shown in FIG. 4A, the first lead 10 and the second lead 20 are opposed to each other in the X direction, and the first groove 21 and the second groove 13 extending in the Y direction orthogonal to the X direction are provided. The configuration of the groove may be any of the examples shown in FIGS. 3A to 3F, or may be other configurations.

The width in the Y direction of the molded body 40 is wider than the width of the first lead 10 and the second lead 20, and the molded body 40 is provided to protrude in the protrusion direction of a hanging pin 10e provided on the side surface parallel to the X direction of the first lead 10 and in the protrusion direction of a hanging pin 20e provided on the side surface parallel to the X direction of the second lead 20. Consequently, the base portion 40c provided on the front surfaces of the leads and the base portion 40d provided on the back surfaces are directly connected at the side surface parallel to the X direction of the molded body 40 (see FIG. 2B).

The peeling of the molded body 40 will occur from the interface between the front surfaces of the leads and the resin at the outer edge of the molded body 40. Consequently, peeling does not occur from the side surface parallel to the X direction of the molded body 40, and peeling is likely to occur and progress from the side surfaces parallel to the Y direction on the sides of the external leads 10B and 20B.

Therefore, in the second lead 20, peeling progressing toward the bonding portion 33 can be suppressed by providing the first groove 21 extending in the Y direction between the bonding portion 33 for the metal wire 31 and the outer edge 40b of the molded body. On the other hand, also in the first lead 10, peeling progressing toward the light emitting element 30 can be suppressed by providing the second groove 13 extending in the Y direction between the light emitting element 30 and the outer edge 40a of the molded body.

In the variation, the first groove 21 is connected to the anchor hole 20b, and the second groove 13 is connected to the anchor hole 10b. However, the configuration is not limited to those of being connected to an anchor hole, and a simple groove of which both ends reach the outer edge of the lead is possible. By making the first groove 21 and the second groove linear configurations extending in the Y direction, the formation of the groove by press processing becomes easy.

In the light emitting device 300 shown in FIG. 4B, in the first lead 10, another second groove 15 is provided between the outer edge 40a of the molded body and the second groove 13. Furthermore, in the second lead 20, another first groove 23 is provided between the outer edge 40b of the molded body and the first groove 21. The configurations of the leads may be any of the examples shown in FIGS. 3A to 3F, or may be other configurations.

In the variation, in the second lead 20, two grooves extending in the Y direction are provided between the bonding portion 33 for the metal wire 31 and the outer edge 40b of the molded body. Also in the first lead 10, two grooves extending in the Y direction are provided between the light emitting element 30 and the outer edge 40a of the molded body. Thereby, peeling progressing from the outer edge 40b of the molded body toward the bonding portion 33 or from the outer edge 40a of the molded body toward the light emitting element 30 can be more effectively suppressed. The number of grooves provided between the outer edge 40b of the molded body and the bonding portion 33 or between the outer edge 40a of the molded body and the light emitting element 30 may each be three or more.

Figure 5:
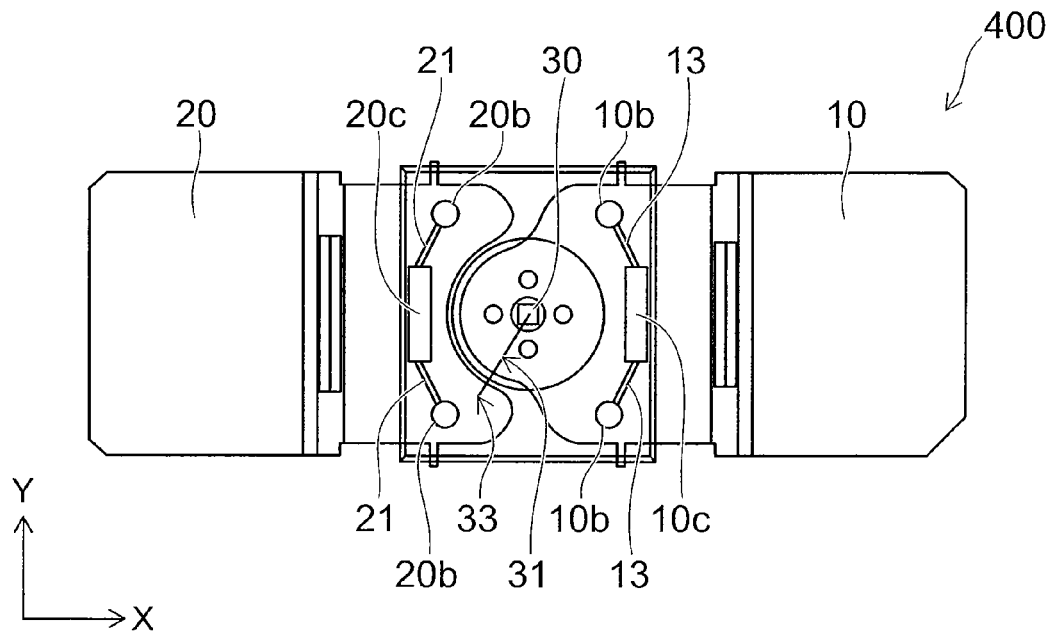
FIG. 5 is a plan view schematically showing a light emitting device according to another variation of the embodiment.

FIG. 5 is a plan view schematically showing a light emitting device 400 according to another variation of the embodiment. In the light emitting device 400, the first groove 21 is provided between the anchor holes 20b and 20c, and the second groove 13 is provided between the anchor holes 10b and 10c.

The first groove 21 and the second groove 13 may not be a boundary like the examples described above which extends in a state of reaching the outer edge of each lead and partitions a portion including the bonding portion 33 or the light emitting element 30 and the other portion of the lead.

Like the variation, in the second lead 20, the groove may be provided so as to suppress peeling progressing from between the anchor hole 20b and the anchor hole 20c toward the bonding portion 33. Furthermore, in the first lead 10, the groove may be provided so as to suppress peeling progressing from between the anchor hole 10b and the anchor hole 10c toward the light emitting element 30.

That is, both ends of the first groove 21 are connected to two of the plurality of anchor holes (through holes) provided in the second lead 20, and further both ends of the second groove 13 are connected to two of the plurality of anchor holes provided in the first lead 10. Thereby, peeling progressing from the outer edge 40b of the molded body is suppressed, and an open fault and characteristic degradation of the light emitting element 30 can be prevented. Thereby, a highly reliable light emitting device can be obtained.

Although the embodiments mentioned above show only examples in which the second groove and the first groove are provided in both of the first lead 10 and the second lead, respectively, the configuration is not limited thereto. For example, a configuration including only one of the first groove and the second groove is possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A light emitting device comprising:
a first lead having an end portion;
a light emitting element fixed on the end portion of the first lead;
a second lead having an end portion, the second lead provided so as to be separated from the first lead and electrically connected to an electrode of the light emitting element via a metal wire bonded to the end portion of the second lead;
a molded body made of a sealing resin and covering the light emitting element, the end portion of the first lead, and the end portion of the second lead; and
a first groove in a front surface of the second lead, the first groove provided between a first portion of the second lead that is in contact with an outer edge of the molded body and a second portion of the second lead that is bonded to the metal wire, the first groove intersecting with a direction that is from the outer edge of the molded body to the second portion, filled with the sealing resin, and extending to an outer edge of the second lead and defining a boundary between the first portion and the second portion.

2. The device according to claim 1, wherein the first groove is provided in a plurality to be aligned in a direction from the first portion toward the second portion between the first portion and the second portion.

3. The device according to claim 1, wherein a width of the molded body is greater than a width of the first lead and a width of the second lead.

4. The device according to claim 1, wherein the sealing resin is a transparent resin that transmits a light emitted from the light emitting element.

5. The device according to claim 1, wherein the end portion of each of the first lead and the second lead is sealed by the molded body, each of the first lead and the second lead includes an external lead portion extending from the molded body and, the external lead portion is bent.

6. The device according to claim 1, wherein
the light emitting element includes one of a stacked body of $In_x(Ga_yAl_{1-y})_{1-x}P$ ($0 \leq x \leq 1$, $0 \leq y \leq 1$), a stacked body of $Al_xGa_{1-x}As$ ($0 \leq x \leq 1$), and a stacked body of $In_xGa_yAl_{1-x-y}N$ ($0 \leq x \leq 1$, $0 \leq y \leq 1$, $x+y \leq 1$), and
the sealing resin is one of a silicone, an epoxy resin, and an acrylic resin.

7. The device according to claim 1, wherein a front surface of the first lead and the front surface of the second lead are coated with a metal that reflects a light emitted by the light emitting element.

8. A light emitting device comprising:
a first lead having an end portion;
a light emitting element fixed on the end portion the first lead;
a second lead having an end portion, the second lead provided so as to be separated from the first lead and electrically connected to an electrode of the light emitting element via a metal wire bonded to the end portion of the second lead;
a molded body made of a sealing resin and covering the light emitting element, the end portion of the first lead, and the end portion of the second lead;
a first groove in a front surface of the second lead, the first groove provided between a first portion of the second lead that is in contact with an outer edge of the molded body and a second portion of the second lead that is bonded to the metal wire, the first groove intersecting with a direction that is from the outer edge of the molded body to the second portion and filled with the sealing resin; and
a second groove in a front surface of the first lead, the second groove provided between a third portion of the first lead that is in contact with the outer edge of the molded body and a fourth portion of the first lead on which the light emitting element is fixed, the second groove intersecting with a direction from the outer edge of the molded body to the fourth portion and filled with the sealing resin.

9. The device according to claim 8, wherein the second groove extends to an outer edge of the first lead and defines a boundary between the third portion and the fourth portion.

10. The device according to claim 8, wherein each of the first groove and the second groove has a cross-sectional configuration in which a width at a bottom surface is less than a width at an opening.

11. The device according to claim 8, wherein the first groove extends linearly in the front surface of the first lead and the second groove extends linearly in the front surface of the second lead.

12. The device according to claim 8, wherein each of the first groove and the second groove has a cross-sectional configuration in which a width of each groove increases with depth from the front surface of the first or second lead.

13. The device according to claim 8, wherein each of the first groove and the second groove has a cross-sectional configuration in which the first groove and the second groove are aligned.

14. The device according to claim 8, wherein
the first lead has a plurality of through holes piercing from the front surface, on which the light emitting element is fixed, to a back surface,
the second lead has a plurality of through holes piercing from the front surface, on which the metal wire is bonded, to a back surface, and
one end of at least one of the first groove and the second groove is connected to one through hole of the plurality of through holes and another end of the at least one of the first groove and the second groove is connected to another through hole of the plurality of through holes.

15. The device according to claim 14, wherein
the molded body includes a first base portion provided on a front surface side of both the first lead and the second lead and a second base portion provided on a back surface side of both the first lead and the second lead, and
the first base portion and the second base potion are connected via the plurality of through holes.

16. The device according to claim 15, wherein the molded body includes a lens portion that condenses a light emitted from the light emitting element and the first base portion is provided between the first lead and the lens portion.

17. The device according to claim 8, wherein the second groove is provided in a plurality to be aligned in a direction from the third portion toward the fourth portion between the third portion and the fourth portion.

18. The device according to claim 8, wherein a width of the molded body is greater than a width of the first lead and a width of the second lead.

19. The device according to claim 8, wherein the front surface of the first lead and the front surface of the second lead are coated with a metal that reflects a light emitted by the light emitting element.

* * * * *